(12) United States Patent
Elward

(10) Patent No.: US 6,512,289 B1
(45) Date of Patent: Jan. 28, 2003

(54) DIRECT CURRENT REGULATION ON INTEGRATED CIRCUITS UNDER HIGH CURRENT DESIGN CONDITIONS

(75) Inventor: John S. Elward, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/568,214

(22) Filed: May 9, 2000

(51) Int. Cl.⁷ .......................... H01L 23/52; H01L 23/48; H01L 23/58
(52) U.S. Cl. ........................... 257/691; 257/48; 257/773
(58) Field of Search ............................. 257/48.691, 773, 257/780; 438/15

(56) References Cited

U.S. PATENT DOCUMENTS

| | | | |
|---|---|---|---|
| 4,220,917 A | * 9/1980 | McMahon, Jr. | 324/73 |
| 5,155,065 A | * 10/1992 | Scheiss | 437/209 |
| RE34,363 E | 8/1993 | Freeman | |
| 5,286,656 A | * 2/1994 | Keown et al. | 437/7 |
| 5,436,558 A | * 7/1995 | Saitoh et al. | 324/158.1 |
| 5,801,536 A | * 9/1998 | Brambilla et al. | 324/522 |
| 5,844,317 A | * 12/1998 | Bertolet | 257/773 |
| 5,900,643 A | * 5/1999 | Preslar et al. | 257/48 |
| 6,180,426 B1 | * 1/2001 | Lin | 438/15 |

FOREIGN PATENT DOCUMENTS

JP 31223 * 1/2000 ........... H01L/21/66

OTHER PUBLICATIONS

"The Programmable Logic Data Book 1999"; available from Xilinx, Inc., 2100 Logic Drive, San Jose, CA 95124; pp. 3–10 to 3–12, pp.5–68 to 5–69.

* cited by examiner

Primary Examiner—Steven Loke
Assistant Examiner—Ori Nadav
(74) Attorney, Agent, or Firm—Jeanette S. Harms; Michael R. Casey

(57) ABSTRACT

An integrated circuit (I/C) assembly includes a dedicated voltage sensor line for determining with a high degree of accuracy the operating voltage at a predetermined sensor point on the IC die. The dedicated voltage sensor line connects the sensor point to an input/output (I/O) structure of the IC die, which in turn is connected to a voltage sense pin on the package of the IC assembly. In this manner, an end user can accurately monitor the operating voltage at the voltage sensor point on the IC. Additionally, an end user can connect a control circuit to the voltage sensor pin to control either the supply voltage or secondary parameters.

10 Claims, 1 Drawing Sheet

DIRECT CURRENT REGULATION ON INTEGRATED CIRCUITS UNDER HIGH CURRENT DESIGN CONDITIONS

FIELD OF INVENTION

This invention relates to an integrated circuit (IC) assembly that permits a user to monitor the voltage applied at the core of the IC.

BACKGROUND OF THE INVENTION

Programmable logic devices (PLDs) are user configurable integrated circuits (ICs) that implement digital logic functions. Field programmable gate arrays (FPGAs), one type of PLD, typically include configurable logic blocks (CLBs), input/output (I/O) blocks, and a programmable routing matrix for interconnecting the CLBs and I/O blocks. FPGAs, in general, are described in U.S. Pat. Re 34,363, reissued on Aug. 31, 1993 and incorporated by reference herein.

In the Virtex™ family of FPGAs, the programmable routing matrix provides five types of routing resources. "The 1999 Xilinx Programmable Logic Data Book", pages 3–10 to 3–12. The first type of routing resource, local routing, is used for interconnecting elements within each CLB and horizontally adjacent CLBs. The second type of routing resource, general purpose routing, is located in the horizontal and vertical routing channels associated with the rows and columns of CLBs. General purpose routing includes general routing matrices (GRMs) that provide CLBs access to the general purpose routing, single-length lines that connect adjacent GRMs, buffered Hex lines that connect GRMs six blocks away, and long lines that distribute signals across the FPGA. The third type of routing resource, I/O routing, provides an interface between the CLB array and the I/O blocks. The fourth type of routing resource, dedicated routing, is provided for on-chip tristate buses and for carry signals. In the Virtex FPGA, four partitionable tristate bus lines are provided for each CLB row and two nets per CLB propagate carry signals vertically to the adjacent CLB. Finally, the fifth type of routing resource, global routing, distributes clocks and other signals having high fanout throughout the device. Primary global routing includes four dedicated global nets for distributing clock signals. Secondary global routing includes 24 backbone lines, 12 lines at the top of the chip and 12 lines at the bottom, that can distribute clock or non-clock signals.

Other families of FPGAs provide different routing resources as well as different CLB and I/O block elements. Other types of PLDs, such as complex programmable logic devices. (CPLDs), also vary siginificantly in architecture.

Due to the variability of function generators, I/O blocks, and routing resources, PLDs have a wide range of power consumption. Moreover, typically because of system constraints, PLDs must also operate under a wide range of frequencies, which also affects their power consumption. Finally, as PLDs are being designed with reduced process geometries, PLDs have lower operating voltages, thereby also affecting their power consumption.

A PLD assembly typically experiences a voltage drop from the resistances corresponding to its various components. Ohm's Law states that a voltage is equal to the product of the current flowing through a component and that component's resistance ($V=I \times R$). Therefore, as current flow increases in the PLD, the voltage drop experienced in the PLD assembly increases proportionally. As a result, the voltage applied at the core of the IC die in the PLD assembly can be significantly lower than the supply voltage. Moreover, with the trend toward lower supply voltages, there is very little margin for voltage drop before reduced performance and/or functional errors may occur at the core of the IC die.

To address these concerns, those skilled in the art have proposed several solutions. For example, one typical solution is to provide a voltage regulator at a location on the printed circuit board (PCB) that is central to its destination ICs. In this manner, the resistive path to the PLD is reduced and any voltage drop on the path is minimized. Occasionally, centralized voltage regulators also use a sensor point located on the PCB to regulate voltage at that localized point. With such solutions, however, the voltage drop of the PLD itself is not monitored or reduced.

Another proposed solution is to add more power pins to the PLD, thereby reducing the effective length of resistive paths within the PLD. However, with increased functionality requirements, many PLDs are already pad limited. Therefore, the advantage of a possible reduced voltage drop is more than offset by the significant disadvantage of reduced input/output connectivity.

Therefore, a need has arisen for a structure and method that can accurately monitor the voltage at a particular location on the PLD as well as compensate for a voltage drop on the PLD, all without significantly affecting input/output connectivity.

SUMMARY OF THE INVENTION

The present invention addresses these problems by adding a sensor point on an integrated circuit (IC) die. In one embodiment, the sensor point is centrally located on the IC die and a dedicated sensor trace connects the sensor point to one of a plurality of input/output (I/O) structures located at the periphery of the IC die. A power bond wire connects that I/O structure to a dedicated voltage sensor pin provided on the IC's package.

In this manner, the end user can accurately monitor the voltage at the sensor point on the IC die. This information can then be advantageously used to regulate the power supply on the IC die. Specifically, if the voltage is deviating from an acceptable range, the end user can provide a different external voltage, thereby ensuring a proper internal operating voltage on the IC die.

Moreover, information from the sensor point can also be used to improve various engineering features including circuit architecture, packaging, printed circuit board design, and other design areas. Additionally, information from the sensor point can be used to control secondary system parameters, such as clock speed, fan speed, software routines, and IC programming.

Figure 1:
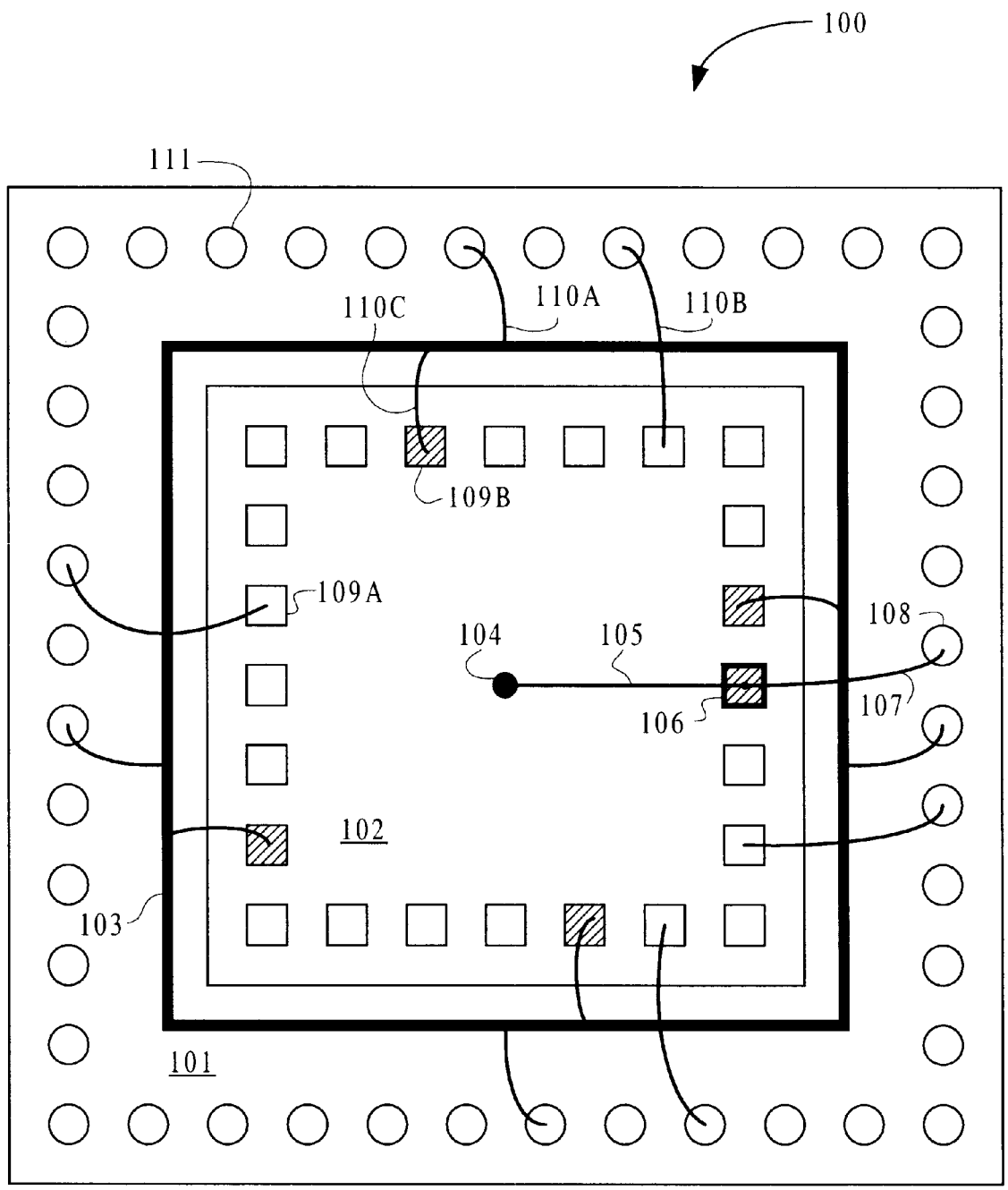
FIG. 1 is a simplified view of a programmable logic device assembly in accordance with the present invention.

The advantages, features, and design of the present invention will become apparent from the following detailed description of the invention.

DETAILED DESCRIPTION OF THE INVENTION

FIG. 1 illustrates one embodiment of an assembly 100 in accordance with the present invention. Assembly 100 may be a "cavity-up" or "cavity-down" assembly. In a cavity-up assembly, an integrated circuit (IC) die 102 is attached to the inside bottom of a package 101. In a cavity-down assembly, die 102 is attached to the inside top of package 101, thereby providing optimal heat transfer to the ambient air. Assembly 100 includes a package 101, a die 102 having a plurality of input/output (I/O) structures 109 for providing signals to and from die 102, and a power structure 103. Package 101 may be ceramic or any other form of packaging material. Die 102 may be a programmable logic device (PLD) or any other type of integrated circuit (IC).

In this embodiment, power structure 103 is formed as a conductive metal ring and is built into the cavity of package 101. In other embodiments, the power structure may be formed as a conductive metal plane of package. Power structure 103 is typically connected to predetermined power I/O structures 109B (shown as squares having a fill pattern) with power bond wires 110C. Having multiple power I/O structures 109B connected to power structure 103 collectively decreases the net resistance between package 101 and die 102. Each power I/O structure 109B includes a sandwich of a metal pad layer, a power bond wire 110C, and an internal power bus (described below).

Note that a typical assembly includes two power structures, one structure for the highest circuit voltage VDD on the die and another structure for the lowest circuit voltage VSS on the die. In FIG. 1, power structure 103 provides voltage VDD to die 102. The power structure for voltage VSS (not shown for clarity) is connected to its associated power I/O structures 109B of die 102 in the same manner as power structure 103. Note that although only four power I/O structures 109B are shown in FIG. 1, depending on the size of the die and the functionality thereon, a die may include many more power I/O structures. Die 102 further includes a plurality of power buses (also not shown for clarity) coupled to power I/O structures 109B for distributing voltages VDD and VSS on chip.

To facilitate data communication between die 102 and external devices (not shown), data I/O structures 109A are connected to pins 111 on package 101 via pin bond wires 110B. Each data I/O structure 109A includes a pad and I/O circuitry. In one embodiment, if die 102 is a programmable logic device, then the I/O circuitry includes an I/O block. For more detailed information on I/O blocks, see the 1999 Xilinx Data Book, pages 5–68 to 5–69, which is incorporated by reference herein.

In accordance with the present invention, assembly 100 includes at least one sensor point 104 located on die 102. Sensor point 104 is connected to an internal VDD bus (not shown) provided on die 102. Sensor point 104 can be located at any point on die 102 where it is desired to know the local operating voltage. In one embodiment, sensor point 104 is centrally located on die 102. In an alternative embodiment, multiple sensor points are provided based on the architecture or implementation of the circuits (not shown) on die 102.

A dedicated metal sensor trace 105 on die 102 connects sensor point 104 to a sensor I/O structure 106. Sensor I/O structure 106, which is similar in structure to power pads 109B, is then connected to a voltage sensor pin 108 on package 101 via a voltage sensor bond wire 107. Note that if multiple sensor points are provided, then each sensor point should have a corresponding dedicated trace, sensor I/O structure, voltage sensor bond wire, and voltage sensor pin.

In accordance with the present invention, sensor trace 105 is dedicated to providing the voltage at sensor point 104. Specifically, sensor trace 105 is not part of the standard interconnect providing signals on and functionality to die 102. For example, if die 102 is a Virtex FPGA, sensor trace 105 is not part of the local routing, general purpose routing, I/O routing, dedicated routing, or global routing. Thus, sensor trace 105 does not provide any signals associated with any CLB, I/O block, clock, or any other element/signal on die 102. The sole purpose of sensor trace 105 is for monitoring the voltage at sensor point 104.

To measure the voltage-at sensor point 104, the end user applies power to assembly 100 and electrically connects a measurement device (not shown) to the voltage sensor pin 108. Examples of such measurement devices include a voltmeter or an input to an external voltage regulator circuit. Using the output of the measurement device, an end user can adjust the supply voltage, i.e. voltage VDD, if the operating voltage at sensor point 104 deviates from a specified range.

In another embodiment, voltage sensor pin 108 is electrically connected to a control circuit, which in turn controls another circuit, component, or device. In this manner, the output of the control circuit automatically triggers certain actions or changes within the end user's system. For example, after power is applied to assembly 100, the control circuit can monitor the voltage at sense point 104 and adjust the supply voltage if the operating voltage at sense point 105 deviates from the acceptable range. Similarly, the control circuit can be used to control secondary systems such as clock speed, fan speed, software routines and/or reprogramming cycles (assuming die 102 is a programmable logic device). If multiple sensor points 105 are desired on assembly 100, each voltage sensor pin 108 can be connected to either a control circuit or a measurement device.

The present invention provides a structure and method for monitoring the voltage at a predetermined sensor point on an IC. Although the present invention is described in reference to the embodiment shown in FIG. 1, modifications to that embodiment and other, various embodiments will be apparent to those skilled in the art. Therefore, the scope of the present invention should only be defined by the appended claims.

What is claimed is:

1. An integrated circuit (IC) assembly comprising:

a package having a voltage sensor pin;

an IC die disposed on the package, the IC die having a plurality of input/output (I/O) structures;

a power structure disposed on the package for providing a supply voltage;

a power bond wire connecting a first I/O structure and the power structure, thereby providing the supply voltage to the IC;

an internal sensor point located on the integrated circuit die;

a dedicated trace connecting the internal sensor point to a second I/O structure; and a sensor bond wire connecting the second I/O structure and the voltage sensor pin, wherein the internal sensor point provides an internal voltage of the IC to regulate the supply voltage such that a different supply voltage is supplied to the IC when the internal voltage deviates from an acceptable range.

2. The IC assembly of claim 1 wherein the internal sensor point is centrally located on the IC die.

3. The IC assembly of claim 1 wherein the power structure comprises a plane of electrically conductive material.

4. The IC assembly of claim 1 wherein said power structure comprises a ring of conductive material.

5. The IC assembly of claim 1, further comprising a measurement device for connecting to the voltage sensor pin for sensing the internal voltage at the internal sensor point.

6. The IC assembly of claim 5, wherein the measurement device comprises a voltmeter.

7. The IC assembly of claim 5, further comprising a control circuit for changing between the supply voltage and the different supply voltage supplied to the IC based on a measurement of the measurement device.

8. The IC assembly of claim 7, wherein the control circuit further provides control of a clock speed of the IC.

9. The IC assembly of claim 7, wherein the control circuit further provides control of a reprogramming of the IC.

10. The IC assembly of claim 7, wherein the control circuit further provides control of software routines of the IC.

* * * * *